United States Patent
Frey et al.

(10) Patent No.: US 6,592,664 B1
(45) Date of Patent: Jul. 15, 2003

(54) METHOD AND DEVICE FOR EPITAXIAL DEPOSITION OF ATOMS OR MOLECULES FROM A REACTIVE GAS ON A DEPOSITION SURFACE OF A SUBSTRATE

(75) Inventors: Wilhelm Frey, Palo Alto, CA (US); Franz Laermer, Stuttgart (DE); Klaus Heyers, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/656,546

(22) Filed: Sep. 6, 2000

(30) Foreign Application Priority Data

Sep. 9, 1999 (DE) .......................................... 199 43 064

(51) Int. Cl.⁷ .............................................. C30B 25/08
(52) U.S. Cl. ............................ 117/89; 117/94; 117/93; 117/101; 117/105; 117/200; 118/715
(58) Field of Search ............................... 117/89, 94, 95, 117/101, 200, 105; 118/715

(56) References Cited

U.S. PATENT DOCUMENTS

| 3,968,019 | A | * | 7/1976 | Hanazono et al. | .......... 204/192 |
| 4,049,533 | A | * | 9/1977 | Golyanov et al. | .......... 204/298 |
| 4,596,645 | A | * | 6/1986 | Stirn | .......... 204/192 S |
| 4,974,344 | A | * | 12/1990 | Ohta | .......... 118/723 |

FOREIGN PATENT DOCUMENTS

| JP | 63 282192 | * | 11/1988 |
| JP | 03-279294 | * | 12/1991 |

* cited by examiner

Primary Examiner—Robert Kunemund
(74) Attorney, Agent, or Firm—Kenyon & Kenyon

(57) ABSTRACT

A method for epitaxial deposition of atoms or molecules from a reactive gas on a deposition surface of a substrate is described. The method includes the following steps:

a first amount of energy is supplied by heating at least the deposition surface; and an ionized inert gas is conducted, at least from time to time, onto the deposition surface in order to supply, at least from time to time, a second amount of energy through the effect of ions of the ionized inert gas on the deposition surface.

The first amount of energy is less than the energy amount necessary for the epitaxial deposition of atoms or molecules of the reactive gas on the deposition surface. A sum of the first energy amount and the second energy equaling, at least from time to time, a total amount of energy that is sufficient for the epitaxial deposition of atoms or molecules of the reactive gas onto the deposition surface.

25 Claims, 2 Drawing Sheets

METHOD AND DEVICE FOR EPITAXIAL DEPOSITION OF ATOMS OR MOLECULES FROM A REACTIVE GAS ON A DEPOSITION SURFACE OF A SUBSTRATE

FIELD OF THE INVENTION

The present invention relates to a method of epitaxial deposition of atoms or molecules from a reactive gas on a deposition surface of a substrate. The present invention relates to a corresponding device which includes a heating device for supplying energy into the substrate, thereby heating at least the deposition surface, and a reactive gas supply device for conducting the reactive gas onto the heated surface of the substrate.

BACKGROUND INFORMATION

Methods for deposition, in particular for epitaxial deposition, of atoms from a reactive gas on a deposition surface of a substrate are conventional. In particular, such methods for deposition of silicon or silicon carbide from the gaseous phase on a substrate have been used. For this purpose, a suitable reactive gas is conducted onto a heated deposition surface of a substrate arranged, for example, in a vacuum chamber. In such deposition methods, also referred to as Chemical Vapor Deposition (CVD), the minimum temperature of the deposition surface of the substrate in systems normally used in industry for silicon deposition is approximately 1000° C. and for silicon carbide deposition approximately 1600° C. Such high temperatures on the deposition surface of the substrate are necessary in order to thermally activate the atoms of the reactive gas to be adsorbed from the gaseous phase after the reactive gas impinges on the deposition surface. Atoms activated in this manner are characterized by increased mobility, a sufficient mobility enabling them to conform to the lattice position of a host substrate. In this manner a desired monocrystalline layer growth is achieved on the deposition surface of the substrate.

The relatively high operating temperatures used in such deposition methods have the disadvantage that only substrates made of highly thermostable materials can be used for deposition. Furthermore, particularly in the case of silicon carbide deposition, the deposition systems cannot be made of a neutral quartz material that is advantageous for the deposition process, since this material has insufficient resistance to such high operating temperatures. The use of highly refractory graphite as a construction material for deposition systems of this type is not optimum, since graphite contaminates the interior of the deposition systems that yields an unacceptable deposition result in deposition processes subject to problems.

SUMMARY

The method according to the present invention includes the following steps:

A first amount of energy is supplied by heating at least the deposition surface. The first amount of energy is less than the energy amount necessary for the epitaxial deposition of atoms or molecules of the reactive gas on the deposition surface.

An ionized inert gas is conducted, at least from time to time, onto the deposition surface in order to supply, at least from time to time, a second amount of energy through the effect of ions of the ionized inert gas on the deposition surface. The first energy amount and the second energy amount add up, at least from time to time, to a total amount of energy that is sufficient for the epitaxial deposition of atoms or molecules of the reactive gas onto the deposition surface.

As a result, due to the supply of the second amount of energy and the effects of the inert gas ions on the deposition surface, the supply of thermal energy necessary for epitaxial layer deposition can be advantageously lower than in conventional deposition methods in which a supply of thermal energy is provided exclusively to achieve the necessary deposition temperature on the deposition surface of the substrate. This is due to the fact that, because of the effect of the ions of the ionized inert gas on the substrate surface, an additional activation energy favoring epitaxial deposition is provided for the atoms of the reactive gas to be adsorbed from the gaseous phase. This activation energy is added to the first thermally supplied energy amount to form a total amount of energy. The mobility of the reactive gas atoms to be deposited on the deposition surface is increased by the total amount of energy resulting from the sum of energy amounts supplied onto the deposition surface independently of one another, so that the atoms can conform to the lattice locations serving as hosts, so that epitaxy, i.e., monocrystalline layer growth, is obtained. Thus, the total amount of energy supplied to the deposition surface is sufficient to guarantee epitaxial deposition of the reactive gas atoms on the deposition surface of the substrate as activation energy, and the temperature to be achieved by heating the deposition surface of the substrate is advantageously lower as compared to that of conventional deposition methods. This allows thermally unstable substrates such as porous silicon or porous silicon carbide substrates to be used for layer deposition, while using quartz deposition systems, which have sufficiently high stability at the deposition temperatures. The deposition temperatures obtained after heating the deposition surface of the substrate are now relatively low and do not negatively affect the deposition process through contamination, which would occur, for example, if refractory graphite were used as the construction material.

According to an advantageous embodiment, the first energy amount and the second energy amount are supplied to the deposition surface at different times. Due to the separation in time of the supply of the two energy amounts, a controlled and accurate energy supply to the deposition surface is achieved in a simple and reliable manner to provide sufficient activation energy for deposition of the reactive gas atoms on the deposition surface. Advantageously, thermal energy (first energy amount) is initially supplied to the deposition surface. When the desired temperature is reached on the deposition surface, the ionized inert gas is conducted onto it, thereby supplying the second energy amount.

The ionized inert gas is advantageously conducted separately from the reactive gas in the direction of the deposition surface. By conducting the ionized inert gas in the direction of the deposition surface separately from the reactive gas the ionized inert gas is prevented from mixing with the reactive gas for a sufficiently long period of time, so that undesirable gas phase reactions occur between the two gases before they impinge on the deposition surface. The separate supply of the two gases in the direction of the deposition surface also enables both the reactive gas and the ionized inert gas to be conducted, as uniformly distributed as possible, onto the entire deposition surface in a controlled and optimum manner.

The ionized inert gas, for example, is conducted onto the deposition surface at the same time as the reactive gas. By conducting both gases onto the deposition surface simultaneously, the resulting total time of the deposition process is advantageously reduced.

According to an another embodiment, the ionized inert gas and the reactive gas are conducted onto the deposition surface at separate times, with either first the ionized inert gas and then the reactive gas or first the reactive gas and then the ionized inert gas being conducted onto the deposition surface in each deposition cycle. This provides a particularly compact design of the system used for deposition, since only one common gas supply device must be provided for both the inert gas or ionized inert gas and the reactive gas, and an ionizing unit can be provided in this supply device, which is in operation when inert gas is being supplied, to generate ionized inert gas, and is switched into a non-operational state when reactive gas is being supplied. Furthermore, by supplying ionized inert gas and (non-ionized) reactive gas at different times, the occurrence of undesirable gas phase reactions between the two gases or within the reactive gas is prevented in a simple and reliable manner.

The ionized inert gas and the reactive gas are conducted, for example, onto the deposition surface at different times in an alternating sequence. The ionized inert gas and the reactive gas can be conducted onto the deposition surface in short individual steps alternating in a relatively quick sequence. The ionizing unit is turned on and off alternately with respect to the supply of the reactive gas and synchronously with respect to the supply of inert gas. This means that the ionizing unit is turned off when reactive gas is supplied onto the deposition surface and the reactive gas supply onto the deposition surface is interrupted when ionized inert gas is supplied onto the deposition surface with the ionizing unit turned on. In this manner the ionized inert gas and the reactive gas can be conducted onto the deposition surface at different times and alternately, the sequence of the supply of the two gases onto the deposition surface being controllable in a relatively simple manner. It is furthermore possible to conduct inert gas onto the deposition surface continuously and thus not alternately, in which case only the switching of the ionizing unit on and off and the supply of the reactive gas onto the deposition surface takes place alternately in a suitable manner. In this case, supply of the ionized inert gas and the reactive gas onto the deposition surface also occurs at different times and alternately.

According to another embodiment, the ionized inert gas and the reactive gas are conducted spatially separated in the direction of the deposition surface. Conducting the two gases spatially separated in the direction of the deposition surface, the ionized inert gas and the reactive gas can be conducted in the direction of the deposition surface and at the same time without undesirable gas phase reactions taking place between the inert gas or the ionized inert gas and the reactive gas. A suitable design of the gas supply device allows the ionized inert gas and the reactive gas to be conducted separately onto the deposition surface so that excessive mixing of the two gases and/or mixing during a relatively longer time prior to impinging on the deposition surface, resulting in undesirable gas phase reactions, can be avoided or at least reduced.

The inert gas is ionized, for example, separately from the reactive gas. When ionization of the inert gas takes place separately undesirable gas phase reactions between these two gases cannot take place without the presence of the reactive gas. In such deposition processes surface reactions between the ionized inert gas or reactive gas and the deposition surface are desirable. However, gas phase reactions between the inert gas or the ionized inert gas and the reactive gas before, during and after the ionization of the inert gas is to be avoided since such gas phase reactions would negatively affect such a layer deposition. Similarly, a gas phase reaction involving only the reactive gas would make proper layer growth impossible. Ionization of the inert gas and thus also the supply of the inert gas in the direction of the deposition surface therefore advantageously occurs separately from the reactive gas; the two gases, i.e., of the ionized inert gas and reactive gas advantageously only mix for a short time and, for example, immediately before the two gases impinge upon the deposition surface. Spatial separation of the gases can be supported by additionally conducting the reactive gas and ionizing the inert gas at different times; the reactive gas can be supplied and the inert gas ionized alternately, for example.

According to an advantageous embodiment, the inert gas is ionized using a microwave plasma source. The inert gas is converted into a high-density plasma that has low-energy ions and electrons using a microwave plasma source. In this manner damage to the deposition surface, due to excessive energy supply by the ionized inert gas, is avoided. Such damage to the deposition surface of the substrate is referred to as ion damage. By using a microwave plasma source, the thermally induced defect density of the substrate material on the deposition surface can be minimized. Furthermore, the ionized inert gas present as a microwave plasma has the basic advantage that no high voltages are needed to generate plasma in the proximity of the plasma, which would also result in harmful side effects with respect to the deposition process due to capacitive injection into the plasma. Since higher voltages in the proximity of the plasma result in acceleration of electrons and ions of the ionized inert gas, the deposition surface of the substrate may be damaged and/or the layer growth and layer quality may be negatively affected. Such disadvantageous effects on the deposition process are avoided by using a microwave plasma source to ionize the inert gas. Using a microwave plasma source, a large-volume homogeneous microwave plasma that has low ion/electron energy, high density and low plasma potential can be advantageously generated. Advantageously, no electrodes are used for generating a microwave plasma, so that no undesirable contamination due to electrode material erosion can occur.

According to another embodiment, the inert gas is ionized using a Surfatron source. If a Surfatron source is used, a microwave field generating a plasma is conducted along a quartz Surfatron in the boundary layer between plasma and quartz wall material, so that relatively highly extended plasmas, forming a plasma beam can be generated. The Surfatron source also allows a high-volume, homogeneous microwave plasma that has low ion/electron energy, high density and low plasma potential to be generated. The Surfatron is a plasma source which has no electrodes, so that undesirable contamination due to electrode material erosion during deposition cannot occur.

In yet another embodiment, the inert gas is ionized using high-frequency excitation, for example by an inductive plasma source. The higher voltages applied to plasma during high-frequency excitation require an appropriate shielding of the plasma thus electrically affected in order to achieve satisfactory deposition results.

Porous silicon, for example, is used as the substrate. Silicon, for example, is used as the epitaxially deposited material. Silane or a silane mixture, for example, is used as the reactive gas. Helium and/or argon, for example, is used as the inert gas. The deposition surface of the substrate is heated to a temperature of approximately 600° C., for example. Silicon can be advantageously deposited on porous silicon with ion support at a relatively low temperature of 600° C. on the deposition surface without disadvantageous damage to the substrate (porous silicon).

According to another embodiment, porous silicon carbide, for example, is used as the substrate. Silicon carbide, for example, is used as the epitaxially deposited material. A mixture of a silicon carrier gas, for example silane, and a hydrocarbon gas, for example methane, is used as the reactive gas. Helium and/or argon, for example, is used as the inert gas. The deposition surface of the substrate is heated to a temperature of approximately 800° C. to 900° C., for example. In this manner silicon carbide can be deposited with ion support at the relatively low temperature of the substrate surface below the collapse temperature of over 900° C. of the porous silicon carbide. Furthermore epitaxial growth of silicon carbide on porous silicon (instead of porous silicon carbide) offers the advantage that a relatively inexpensive silicon carbide thin layer deposition is possible. By providing a porous silicon intermediary layer, the different lattice spacings between the silicon host lattice (substrate) and the silicon carbide lattice (material to be deposited) are compensated so that a high-quality silicon carbide layer growth with good crystalinity and low defect density on a relatively inexpensive silicon substrate becomes possible. Furthermore it is advantageous to transfer silicon carbide thin layers to other relatively inexpensive substrate using a thin-layer copying process ("smart dicing") when depositing silicon carbide on the porous silicon carbide substrate, and to reuse the relatively expensive silicon carbide initial substrate to coat silicon carbide thin layers, so that the initial silicon carbide substrate used as a wafer is recovered after each deposition process. Thus, a plurality of deposition processes can be run using the same initial substrate. Therefore, deposition of silicon or silicon carbide on a porous silicon substrate surface or silicon carbide substrate surface can be implemented relatively inexpensively. A subsequent oxidation process of the porous silicon underneath a deposited silicon layer can be used or a thinlayer copying process ("smart dicing") can be provided on a thermally oxidized counter-wafer in order to inexpensively obtain an SOI substrate or an SiCOI substrate.

According to another embodiment, porous silicon, for example, is used as the substrate. Silicon-germanium, for example, is used as the epitaxially deposited material. A mixture of a silicon carrier gas, for example silane, or a germanium carrier gas as the reactive gas. Helium and/or argon, for example, as the inert gas. The deposition surface of the substrate is heated to a temperature of approximately 800° C. to 900° C., for example. Thus, the epitaxially deposited material is not limited to silicon or silicon carbide, but may include silicon-germanium.

The device according to the present invention includes:
  an ionization unit for the separate ionization of an inert gas with respect to the reactive gas; and
  an inert gas supply device for conducting the ionized inert gas onto the deposition surface of the substrate.

Such a device allows atoms or molecules to be epitaxially deposited from a reactive gas on a deposition surface of a substrate in an efficient and reliable manner.

The inert gas ionization unit is designed, for example, as a microwave plasma source operating by the principle of electron cyclotron resonance (ECR). This allows a high-density plasma to be generated from low-energy ions and electrons, which reduces damage to the deposition surface by ion bombardment and the layers produced after deposition have a low defect density. It is particularly advantageous that the microwave plasma requires no high voltages around it that would also result in harmful side effects due to capacitive injection into the plasma.

According to another embodiment, the inert gas ionizing unit is designed, for example, as a Surfatron source, which has a quartz Surfatron conducting a plasma-generating microwave field. It is advantageous that very extended plasmas in the form of a wide plasma beam can be generated. With both the microwave plasma source and the Surfatron source, large-volume, homogeneous microwave plasmas that have low ion/electron energy, high density, and low plasma potential can be generated.

According to yet another embodiment, the inert gas ionizing unit is designed, for example, as an inductive plasma source. The high-frequency excitation of the inert gas that occurs with a high voltage being applied to the plasma requires proper shielding of the plasma that is electrically affected in order to achieve satisfactory epitaxial deposition results with a low defect density.

The reactive gas supply device advantageously has a gas diffusion ring, which is arranged between an outlet of the inert gas supply device directed toward the heated deposition surface of the substrate and the substrate. Thus, separate supply of the not yet ionized inert gas and the reactive gas and joint supply of the ionized inert gas with the reactive gas directly over the heated deposition surface of the substrate are advantageously possible. The reactive gas should not be conducted together with the inert gas through the ionization units operating as a plasma source because in that case, gas phase reactions between the two gases would take place to a considerable extent, negatively affecting the layer deposition. Layer growth on the deposition surface requires no gas phase reactions, but rather a surface reaction. Therefore, the inert gas and the reactive gas must be conducted onto the deposition surface separately. The inert gas is supplied by the plasma source and the reactive gas is supplied, for example, underneath the plasma source, so that mutual excitation of the two gases cannot take place or can only take place to a very small extent.

It is advantageous if the gas diffusor ring is arranged in a plane located at a distance from the heated deposition surface of the substrate and parallel to it and surrounds the ionized inert gas exiting from the outlet of the inert gas supply device and flowing in the direction of the deposition surface. Such a position and design of the gas diffusor ring allows an initially separated supply of the ionized inert gas and the reactive gas in the direction of the heated deposition surface of the substrate that is optimum with respect to the deposition process; the two gases can freely mix shortly before impinging on the deposition surface.

The substrate is arranged, for example, so that it lies on a substrate electrode in which the heating device, used for heating the deposition surface of the substrate facing away from the substrate electrode, is arranged. Such an arrangement of the substrate and design of the substrate electrode allows compact dimensions of the device and reliable and relatively simple heating of the deposition surface of the substrate to a desired temperature.

According to an another embodiment, the heating device may have the heat-producing radiation device arranged in the proximity of the substrate electrode. A radiation device arranged and designed to be independent of the substrate electrode allows the heating device to be adapted to the layout of the interior of the deposition system so that the heating sequence of the deposition surface of the substrate is optimized. The radiation device is arranged, for example, underneath the substrate electrode.

The device advantageously has a vacuum pump with pressure regulation, with which a pressure in the range of 0.1 µbar to 100 µbar, for example, can be produced. Thus, the very low process pressures that are needed for the different deposition processes can be easily set with a pressure of 1 µbar, for example.

In another embodiment, the device has a component for generating an electric field over the heated deposition surface of the substrate. This electric field makes it possible to further accelerate the thermally excited ions of the ionized inert gas if necessary, whereby the deposition process can be further optimized through a properly controllable additional energy input through the selection of the ion energy. This bias for accelerating the inert gas ions impinging on the deposition surface of the substrate to a predefined value may come from a DC voltage source or a high-frequency AC voltage source. In the latter case this bias voltage is generated by self-biasing on the substrate electrode. The electrical field is used for ion acceleration and influencing the corresponding energy supply in the direction of the substrate. The desired energy supply into the substrate can be controlled via the ion acceleration.

DETAILED DESCRIPTION

Figure 1:
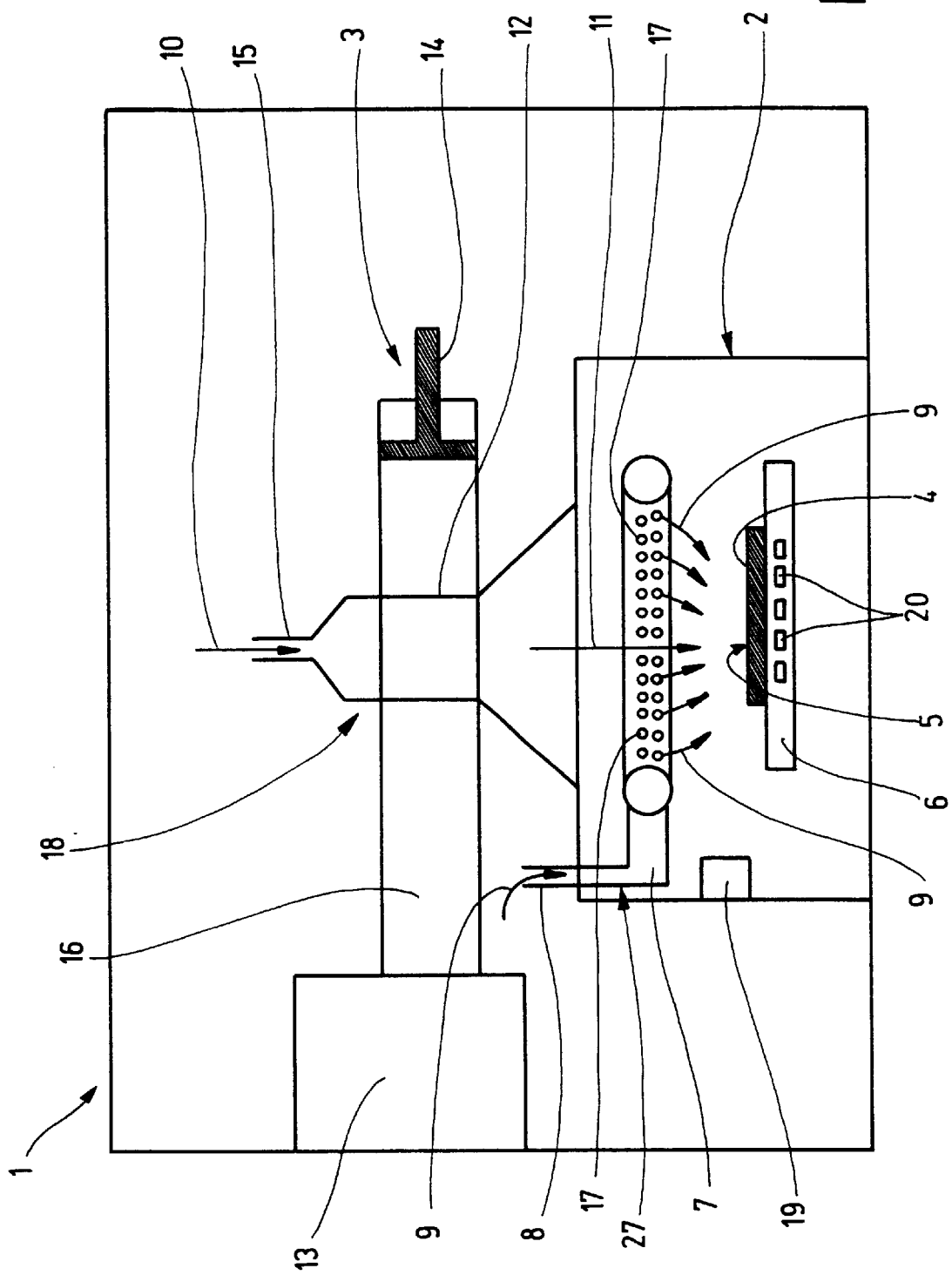
FIG. 1 shows a schematic diagram of an embodiment of a device according to the present invention.

FIG. 1 shows a device 1 for epitaxial deposition of atoms or molecules from a reactive gas 9 on a deposition surface 5 of the substrate 4. Device 1 has a vacuum chamber 2 in which substrate 4 is arranged on substrate electrode 6. Substrate 4 is made, at least on its deposition surface 5, of porous silicon or porous silicon carbide. A gas diffusor ring 7 is arranged above substrate 4 within vacuum chamber 2. Gas diffusor ring 7 has a gas inlet opening 8 located outside vacuum chamber 2 and a plurality of gas outlet openings 17 distributed over the periphery of gas diffusor ring 7 and directed onto deposition surface 5 of substrate 4. Gas diffusor ring 7 is used for conducting reactive gas 9 in a controlled manner through gas inlet opening 8 and gas outlet openings 17 from the outside into vacuum chamber 2 in the direction of deposition surface 5 of substrate 4. reactive gas 9 comes into contact with deposition surface 5 of substrate 4 as uniformly as possible. Reactive gas 9 may contain silane ($SiH_4$) and methane ($CH_4$) for silicon carbide epitaxy.

According to another embodiment, silicon-germanium, for example, can also be used as the epitaxially deposited material. A mixture of a silicon carrier gas, for example silane, and a germanium carrier gas is used as the reactive gas. Helium and/or argon, for example, is used as the inert gas 10, with a porous silicon substrate 4.

Vacuum chamber 2 is connected to an inert gas supply device 18 arranged above gas diffusor ring 7; inert gas supply device 18 is used to conduct an inert gas into vacuum chamber 2 onto deposition surface 5 of substrate 4. Untreated inert gas 10 enters through a gas inlet 15 in inert gas supply device 18 and is conducted into quartz dome 12 of inert gas supply device 18, which radially widens in the direction of the flow. In quartz dome 12, untreated inert gas 10 is converted into ionized inert gas 11 using the ionizing unit 3. Ionizing unit 3 has a microwave resonator 16, designed, for example, as a hollow conductor, which is supplied with microwave energy by a magnetron 13. Using tuning element 14, the hollow space frequency of microwave resonator 16 can be tuned to resonance for optimal adjustment of ionized inert gas 11 acting as plasma with respect to the deposition process. Quartz dome 12 is located in the area of microwave resonator 16 between magnetron 13 and tuning element 14 so that untreated inert gas 10 in quartz dome 12 is exposed to the electromagnetic field of microwave resonator 16. Inert gas 10 entering quartz dome 12 thus absorbs energy from the electromagnetic field of microwave resonator 16 and is converted into ionized inert gas 11.

Atomic helium and/or argon, for example, can be used as inert gas 10. The ions and electrons formed, in particular helium ions and/or argon ions, together with the corresponding electrons of ionized inert gas 11, are conducted in the form of an extended plasma beam onto deposition surface 5 of substrate 4. The plasma beam directed to the center of deposition surface 5 of substrate 4 is radially surrounded by gas diffusor ring 7 designed, for example, in a toroidal shape. Toroidal gas diffusor ring 7 has a wall, which is provided with finely porous gas outlet openings 17 pointing toward deposition surface 5 at different angles. Reactive gas 9, for example, silane for silicon epitaxy and silane in combination with methane for silicon carbide epitaxy, flowing through gas outlet openings 17 comes into contact with deposition surface 5 of substrate 4 at the same time as ionized inert gas 11 conducted centrally through gas diffusor ring 7.

Due to the separate ionization of inert gas 10 by ionizing unit 3, with respect to reactive gas 9, it is ensured that undesirable gas phase reactions of the two gases 9, 10 are avoided. Such gas phase reactions, which negatively affect the epitaxial layer deposition, would take place if reactive gas 9 were conducted at the same time as inert gas 10 through ionizing unit 3. Due to the fact that reactive gas 9 and inert gas 10 or ionized inert gas 11 are supplied spatially separated, such undesirable gas phase reactions are avoided. This separation can be supported by suitable separation in time of the supply of the two gases 9 and 11 in the form of an alternating supply of reactive gas 9, as well as by activation of ionizing unit 3 and supply of ionized inert gas 11.

Deposition surface 5 of substrate 4 is heated to a desired temperature, which may be a maximum of 1000° C. prior to supplying reactive gas 9 and ionized inert gas 11. This is accomplished by a heating device 20 which in the case illustrated is designed, for example, as a direct heating device within substrate electrode 6. However a radiation heater (not illustrated) preferably operating from below substrate 4, for example, can also be used for heating deposition surface 5 of substrate 4.

When atoms or molecules of reactive gas 9 and ions of ionized inert gas 11 impinge on deposition surface 5 of substrate 4, activation energy is provided by the effect of the ions, excited by impact ionization but chemically inert, on deposition surface 5 of substrate 4 of the atoms and molecules of reactive gas 9, which are there adsorbed from the gaseous phase. This activation energy thus does not have to be supplied through thermal activation of heated substrate 4. It is important that sufficient overall excitation energy be provided, through a high particle density of ions and electrons, for the atoms/molecules to be deposited and adsorbed on deposition surface 5. At the same time the energy of individual ions and electrons should not be so high that deposition surface 5 of substrate 4 is damaged by ion bombardment or crystal defects are produced in the growing layer.

Device 1 allows the first energy amount to be supplied by heating substrate 4 and deposition surface 5. The first energy amount is less than the energy amount required for depositing the atoms or molecules of reactive gas 9 on deposition surface 5. The energy amount that is needed to deposit the atoms or molecules of reactive gas 9 and possibly a greater amount is obtained by supplying an ionized inert gas 11 on to the position surface 5 at least from time to time. The second energy amount is supplied in this case, at least from time to time, through the effect of ions of the ionized inert gas 11 on deposition surface 5. The first energy amount and the second energy amount add up to a total energy amount that is sufficient for depositing and reorganizing atoms or molecules from reactive gas 9 on to deposition surface 5 and for reorganizing them according to the predefined crystalline structure.

Above-described device 1 uses, for example, a microwave plasma source operating according to the principle of electron cyclotron resonance (ECR), in which an electron resonance is produced in the external magnetic field using microwave frequency, which results in efficient ionization even at very low pressures of less than 1 μbar. Alternatively a Surfatron source can also be used as a microwave plasma source, in which the plasma-generating microwave field is conducted in the boundary layer between the plasma and the quartz wall, so that very extended plasmas in the form of a plasma beam can be obtained. In either case both plasma source types allow a large-volume homogeneous microwave plasma to be generated. The homogenous microwave plasma's ions and electrons have a moderate energy, where, however, high electron and ion density exists together with a low plasma potential. As mentioned previously, sufficient activation energy is provided for the molecules and atoms to be adsorbed on deposition surface 5 without damaging deposition surface 5 of substrate 4 by ion bombardment.

According to another embodiment (not illustrated) an inductively coupled plasma source, for example, can be used that, contrary to the above-described embodiments, works not with microwave excitation but with high-frequency excitation using a coil designed, for example, in a ring shape and along whose axis the inert gas flows. Since high voltages result in a corresponding acceleration of the electrons and ions contained in ionized inert gas 11, which may cause massive damage to deposition surface 5 and may affect the quality of the layer deposited, proper shielding of the electrical field produced must be provided when such plasma sources are used. Providing appropriate shielding thus allows an inductive plasma source to be used to generate ions for an ion-supported chemical vapor deposition (CVD) process.

Figure 2:
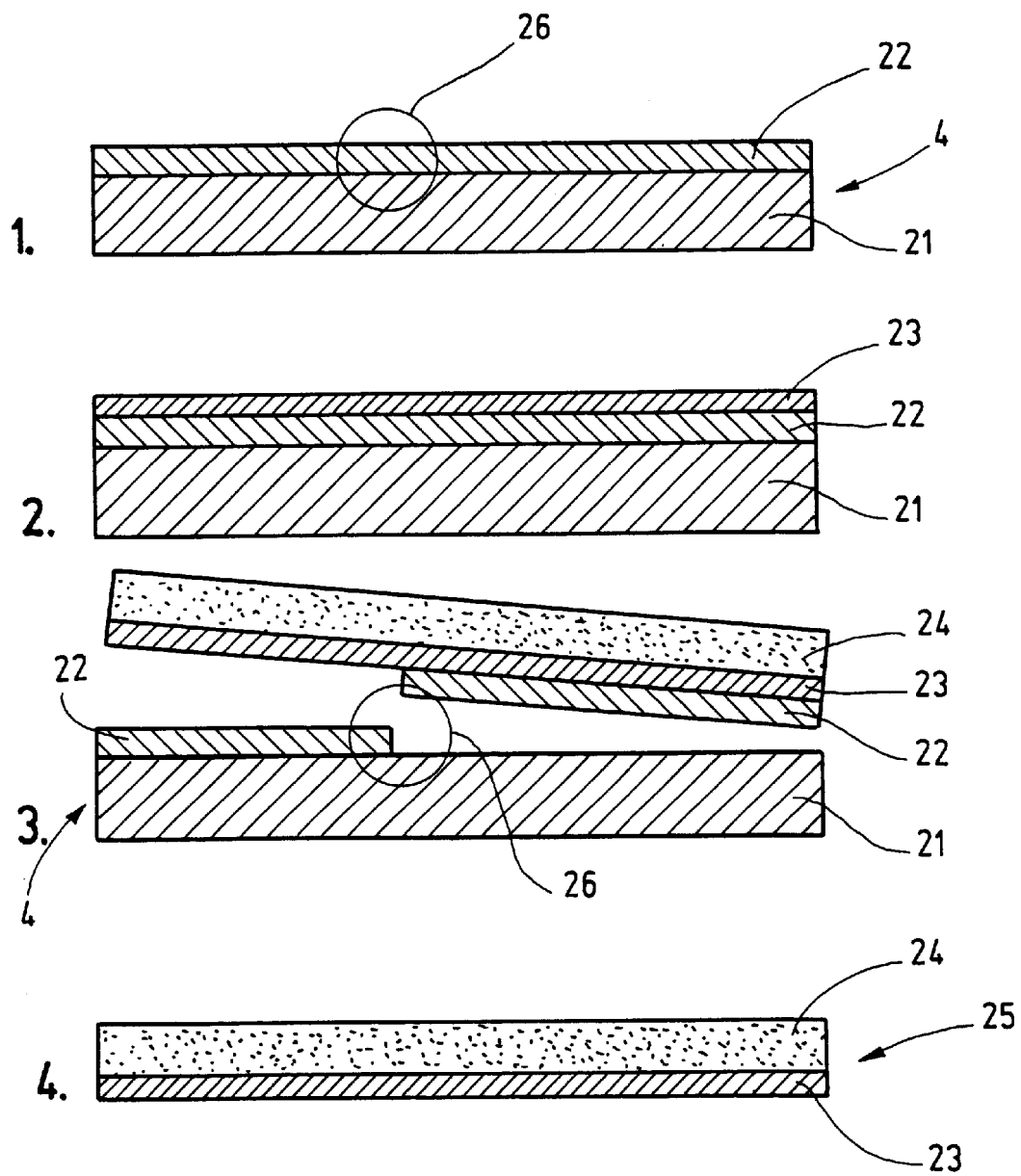
FIG. 2 shows an application of an epitaxial deposition made according to the present invention.

FIG. 2 shows an application of the method according to the present invention for a thin layer copying process in which, after epitaxial deposition of a thin layer 23 on the relatively expensive initial substrate 4, this epitaxially deposited thin layer 23 is transferred onto an inexpensive substrate, whereby the expensive initial substrate 4 becomes available for the epitaxial growth of another thin layer. Expensive initial substrate 4 can thus be reused for several process runs.

In step 1 the relatively expensive substrate 4 is produced. The substrate 4 is used as the initial wafer, and is made of relatively inexpensive silicon 21 or relatively expensive silicon carbide 21 that has a layer 22 of porous silicon or porous silicon carbide at least on its surface, which is a non-crystalline surface layer, is produced. In step 2, silicon or silicon carbide epitaxial layer 23 is deposited on porous silicon or porous silicon carbide layer 22 using the low-temperature epitaxy method according to the present invention. This epitaxial layer 23 is a crystalline silicon or silicon carbide layer. In step 3, epitaxial layer 23 (thin layer) deposited in step 2 is detached from substrate 4, which is used as initial wafer, after bonding onto thermally oxidized counter-wafer 24 (or glass wafer). Counter-wafer 24 is also manufactured from a relatively inexpensive substrate material. The initial wafer (substrate 4) becomes free after each detachment or copying of epitaxial layer 23 (thin layer). In step 4, the porous silicon or porous silicon carbide of layer 22 adhering to epitaxial thin layer 23 is finally removed, whereby a high-quality, inexpensive SOI/SiCOI wafer 25 is obtained. It has counter-wafer 24 made of a relatively inexpensive substrate material and high-quality, crystalline, epitaxial layer 23 (thin layer) adhering to it, transferred from the relatively expensive substrate 4 (initial wafer) using the above-described copying process to substrate 24. By defining rupture joints 26 in porous layer 22, specific structures can be defined. In particular, two-dimensional structures can be produced on the desired epitaxial layer 23 using two-dimensional rupture joints (not shown).

What is claimed is:

1. A method for epitaxial deposition of one of atoms and molecules derived from a reactive gas by chemical reaction, on a deposition surface of a substrate, comprising the steps of:

heating at least a deposition surface of a substrate to supply a first energy amount, the first energy amount being less than an energy amount necessary for an epitaxial deposition of one of atoms and molecules derived from the reactive gas on the deposition surface; and least intermittently conducting an ionized inert gas onto the deposition surface to at least intermittently supply a second amount of energy through the effect of ions of the ionized inert gas on the deposition surface, a sum of the first energy amount and the second energy amount being of a sufficient total energy amount for the epitaxial deposition of the one of atoms and molecules derived from the reactive gas onto the deposition surface.

2. The method according to claim 1, wherein the first energy amount and the second energy amount are supplied at different times to the deposition surface.

3. The method according to claim 1, wherein the ionized inert gas is conducted separately from the reactive gas in a direction of the deposition surface.

4. The method according to claim 1, wherein:
the ionized inert gas is conducted onto the deposition surface at the same time as the reactive gas.

5. The method according to claim 1, wherein:
the ionized inert gas and the reactive gas are conducted onto the deposition surface at different times; and
one of:
the ionized inert gas is supplied to the deposition surface first in each deposition cycle and the reactive gas is supplied to the deposition surface subsequent to the ionized inert gas in each deposition cycle, and
the reactive gas is supplied to the deposition surface first in each deposition cycle and the ionized inert gas is supplied to the deposition surface subsequent to the reactive gas in each deposition cycle.

6. The method according to claim 1, wherein:
the ionized inert gas and the reactive gas are conducted onto the deposition surface at different times in an alternating sequence.

7. The method according to claim 1, wherein:
the ionized inert gas and the reactive gas are conducted spatially separate in a direction of the deposition surface.

8. The method according to claim 1, further comprising the step of:
ionizing the inert gas separately from the reactive gas to form the ionized inert gas.

9. The method according to claim 1, further comprising the step of:
ionizing the inert gas using a microwave plasma source to form the ionized inert gas.

10. The method according to claim 1, further comprising the step of:
ionizing the inert gas using a Surfatron source to form the ionized inert gas.

11. The method according to claim 1, further comprising the step of:
ionizing the inert gas by high-frequency excitation to form the ionized inert gas.

12. The method according to claim 11, wherein:
the inert gas is ionized using an inductive plasma source.

13. A device for deposition of one of atoms and molecules derived from a reactive gas by chemical reaction, on a deposition surface of a substrate, comprising:
a heating device, the heating device supplying an energy amount into the substrate by heating at least a deposition surface of the substrate, the energy amount less than an energy amount necessary for an epitaxial deposition of the one of atoms and molecules derived from the reactive gas on the deposition surface;
a reactive gas supply device conducting the reactive gas onto the heated deposition surface of the substrate;
an ionizing unit for separate ionization of an inert gas with respect to the reactive gas; and
an inert gas supply device conducting the ionized inert gas onto the deposition surface of the substrate.

14. The device according to claim 13, wherein:
the ionizing unit includes a microwave plasma source operating under the principle of electron cyclotron resonance.

15. The device according to one of claim 13, wherein:
the ionizing unit includes a Surfatron source having a quartz Surfatron, the quartz Surfatron conducting a plasma-generating microwave field.

16. The device according to one of claim 13, wherein:
the ionizing unit includes an inductive plasma source.

17. The device according to one of claim 13, wherein:
the reactive supply device has a gas diffusor ring, the gas diffusor ring being arranged between an outlet of the inert gas supply device and the substrate, the outlet of the inert gas supply device being directed toward the heated deposition surface.

18. The device according to one of claim 17, wherein:
the gas diffusor ring is arranged in a plane located at the distance from the heated deposition surface of the substrate and parallel to the heated deposition surface of the substrate, the gas diffusor ring peripherally surrounding the ionized inert gas exiting from the outlet of the inert gas supply device and flowing in the direction of the heated deposition surface.

19. The device according to claim 13, wherein:
the substrate is arranged lying on a substrate electrode, the heating device being arranged within the substrate electrode; and
the deposition surface of the substrate faces away from the substrate electrode may be heated by the heating device.

20. The device according to claim 19, wherein:
the heating device includes a heat-emitting radiation device arranged in the proximity of the substrate electrode.

21. The device according to claim 13, further comprising:
a vacuum pump having a pressure regulator, the pressure regulator producing a pressure in a vacuum chamber, the pressure including a range of 0.1 $\mu$bar to 100 $\mu$bar, the deposition occurring in the vacuum chamber.

22. The device according to claim 13, further comprising:
a device for generating an electrical field over the heated deposition surface of the substrate.

23. A method for epitaxial deposition of one of atoms and molecules derived from a reactive gas by chemical reaction, on a deposition surface of a substrate, comprising the steps of:
heating at least a deposition surface of a substrate to supply a first energy amount, the first energy amount being less than an energy amount necessary for an epitaxial deposition of one of atoms and molecules derived from the reactive gas on the deposition surface, wherein
an epitaxially deposited material includes silicon, and the substrate includes porous silicon; and
at least intermittently conducting an ionized inert gas onto the deposition surface to at least intermittently supply a second amount of energy through the effect of ions of the ionized inert gas on the deposition surface, a sum of the first energy amount and the second energy amount being of a sufficient total energy amount for the epitaxial deposition of the one of atoms and molecules derived from the reactive gas onto the deposition surface, wherein
the reactive gas includes one of silane and a silane mixture, and
an inert gas includes at least one of helium and argon.

24. A method for epitaxial deposition of one of atoms and molecules derived from a reactive gas by chemical reaction, on a deposition surface of a substrate, comprising the steps of:
heating at least a deposition surface of a substrate to supply a first energy amount, the first energy amount being less than an energy amount necessary for an epitaxial deposition of one of atoms and molecules derived from the reactive gas on the deposition surface, wherein
an epitaxially deposited material includes silicon carbide, and
the substrate includes porous silicon carbide; and
at least intermittently conducting an ionized inert gas onto the deposition surface to at least intermittently supply a second amount of energy through the effect of ions of the ionized inert gas on the deposition surface, a sum of the first energy amount and the second energy amount being of a sufficient total energy amount for the epitaxial deposition of the one of atoms and molecules derived from the reactive gas onto the deposition surface, wherein
the reactive gas includes a mixture of a silicon carrier gas and a hydrocarbon carrier gas, the silicon carrier gas including silane, the hydrocarbon carrier gas including methane, and an inert gas includes at least one of helium and argon.

25. A method for epitaxial deposition of one of atoms and molecules derived from a reactive gas by chemical reaction, on a deposition surface of a substrate, comprising the steps of:

heating at least a deposition surface of a substrate to supply a first energy amount, the first energy amount being less than an energy amount necessary for an epitaxial deposition of one of atoms and molecules derived from the reactive gas on the deposition surface, wherein an epitaxially deposited material includes silicon-germanium, and the substrate includes porous silicon; and at least intermittently conducting an ionized inert gas onto the deposition surface to at least intermittently supply a second amount of energy through the effect of ions of the ionized inert gas on the deposition surface, a sum of the first energy amount and the second energy amount being of a sufficient total energy amount for the epitaxial deposition of the one of atoms and molecules derived from the reactive gas onto the deposition surface, wherein the reactive gas includes a mixture of a silicon carrier gas and germanium carrier gas, the silicon carrier gas including silane, and an inert gas includes at least one of helium and argon.

* * * * *

UNITED STATES PATENT AND TRADEMARK OFFICE
CERTIFICATE OF CORRECTION

PATENT NO.     : 6,592,664 B1                                                Page 1 of 1
DATED          : July 15, 2003
INVENTOR(S)    : Frey et al.

It is certified that error appears in the above-identified patent and that said Letters Patent is hereby corrected as shown below:

Column 10,
Line 38, change "least intermittently" to -- at least intermittently --

Signed and Sealed this

Fifteenth Day of June, 2004

JON W. DUDAS
*Acting Director of the United States Patent and Trademark Office*